(12) United States Patent
Wang et al.

(10) Patent No.: US 7,215,551 B2
(45) Date of Patent: May 8, 2007

(54) MEMORY MODULE ASSEMBLY INCLUDING HEAT SINK ATTACHED TO INTEGRATED CIRCUITS BY ADHESIVE

(75) Inventors: Kuang-Yu Wang, Saratoga, CA (US); Jim Ni, San Jose, CA (US); Ren-Kang Chiou, Fremont, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 293 days.

(21) Appl. No.: 10/956,893

(22) Filed: Sep. 29, 2004

(65) Prior Publication Data

US 2006/0067054 A1 Mar. 30, 2006

(51) Int. Cl.
*H05K 7/20* (2006.01)
*H01L 23/36* (2006.01)

(52) U.S. Cl. ........................... 361/707; 257/707
(58) Field of Classification Search ................ 361/707; 257/707

See application file for complete search history.

(56) References Cited

U.S. PATENT DOCUMENTS

| | | | | |
|---|---|---|---|---|
| 4,606,962 A | * | 8/1986 | Reylek et al. | 428/148 |
| 5,109,318 A | * | 4/1992 | Funari et al. | 361/710 |
| 5,313,097 A | | 5/1994 | Haj-Ali-Ahmadi et al. | |
| 5,475,563 A | | 12/1995 | Donahoe et al. | |
| 5,661,339 A | * | 8/1997 | Clayton | 257/678 |
| 5,731,633 A | * | 3/1998 | Clayton | 257/723 |
| 5,751,553 A | * | 5/1998 | Clayton | 361/749 |
| 5,793,609 A | | 8/1998 | Donahoe et al. | |
| 5,892,660 A | * | 4/1999 | Farnworth et al. | 361/728 |
| 6,049,975 A | * | 4/2000 | Clayton | 29/832 |
| 6,091,145 A | * | 7/2000 | Clayton | 257/724 |
| 6,232,659 B1 | * | 5/2001 | Clayton | 257/724 |
| 6,353,538 B1 | * | 3/2002 | Ali et al. | 361/728 |
| 6,362,965 B2 | * | 3/2002 | Bookhardt et al. | 361/719 |
| 6,362,966 B1 | * | 3/2002 | Ali et al. | 361/728 |
| 6,377,460 B1 | * | 4/2002 | Pohl et al. | 361/704 |
| 6,424,532 B2 | * | 7/2002 | Kawamura | 361/708 |
| 6,449,156 B1 | * | 9/2002 | Han et al. | 361/704 |
| 6,661,661 B2 | * | 12/2003 | Gaynes et al. | 361/705 |
| 6,781,848 B2 | * | 8/2004 | Farnworth et al. | 361/752 |
| 7,023,700 B2 | * | 4/2006 | Chiou et al. | 361/704 |
| 7,079,396 B2 | * | 7/2006 | Gates et al. | 361/719 |
| 7,106,595 B2 | * | 9/2006 | Foster et al. | 361/721 |
| 2002/0001180 A1 | * | 1/2002 | Kawamura | 361/715 |
| 2002/0079117 A1 | * | 6/2002 | Coffin et al. | 174/52.1 |
| 2003/0193788 A1 | * | 10/2003 | Farnworth et al. | 361/752 |
| 2005/0276021 A1 | * | 12/2005 | Gates et al. | 361/709 |
| 2006/0056154 A1 | * | 3/2006 | Foster et al. | 361/700 |

FOREIGN PATENT DOCUMENTS

JP 2000251463 A * 9/2000

* cited by examiner

*Primary Examiner*—Anatoly Vortman
(74) *Attorney, Agent, or Firm*—Bever, Hoffman & Harms, LLP; Patrick T. Bever

(57) ABSTRACT

A memory module assembly includes two-plate heat sink attached to one or more of the integrated circuits (e.g., memory devices) of a memory module PCBA by adhesive. The adhesive is either heat-activated or heat-cured. The adhesive is applied to either the memory devices or the heat-sink plates, and then compressed between the heat-sink plates and memory module using a fixture. The fixture is then passed through an oven to activate/cure the adhesive.

17 Claims, 6 Drawing Sheets

MEMORY MODULE ASSEMBLY INCLUDING HEAT SINK ATTACHED TO INTEGRATED CIRCUITS BY ADHESIVE

FIELD OF THE INVENTION

This invention relates to standardized memory modules for expanding the memory capacity of personal computers and other computing systems, and more particularly to memory module assemblies that include heat-sink structures.

BACKGROUND OF THE INVENTION

Heat sinks have been widely used to assist in cooling electronic components. Some microprocessors have heat sinks attached to allow for higher-frequency operation. Other components such as memory modules may also benefit from heat sinks.

Most personal computers (PC's) are shipped with sockets for memory modules so that their owners can later add additional modules, increasing the memory capacity of the PC. Other non-PC devices may also use memory modules designed for PC's. High-volume production and competition have driven module costs down dramatically, benefiting the buyer.

Memory modules are made in many different sizes and capacities, with the older 30-pin modules replaced by 72-pin, 168-pin, and other size modules. The "pins" were originally pins extending from the module's edge, but now most modules are lead-free, having metal contact pads, fingers, or leads. The modules are small in size, some being about 5.25 inches long and 1.2 or 1.7-inches high.

Conventional memory modules include a small printed-circuit board (PCB) substrate and several surface mounted components (e.g., memory devices) mounted on one or both surfaces of the PCB substrate. The PCB substrate is typically a multi-layer board with alternating laminated layers of fiberglass insulation and foil or metal interconnection layers. The contact pads (or other contact structures) are typically aligned along a bottom (connector) edge of the PCB substrate. The interconnect layers define wiring traces that provide signal paths between the surface mounted components and the contact pads. The surface mounted components (e.g., memory devices) are soldered or otherwise attached to one or both surfaces of the substrate, with each component typically including one or more integrated circuit (IC) "chips" that are packaged in inexpensive surface-mount packages such as small-outline J-leaded (SOJ) packages, plastic leaded chip carriers (PLCC's), thin small-outline packages (TSOP) or small-outline (SO) packages. The number of memory devices mounted on the PCB substrate of a memory module depends on the capacity and the data-width of the memory chips and the size of the memory module.

Figure 13:
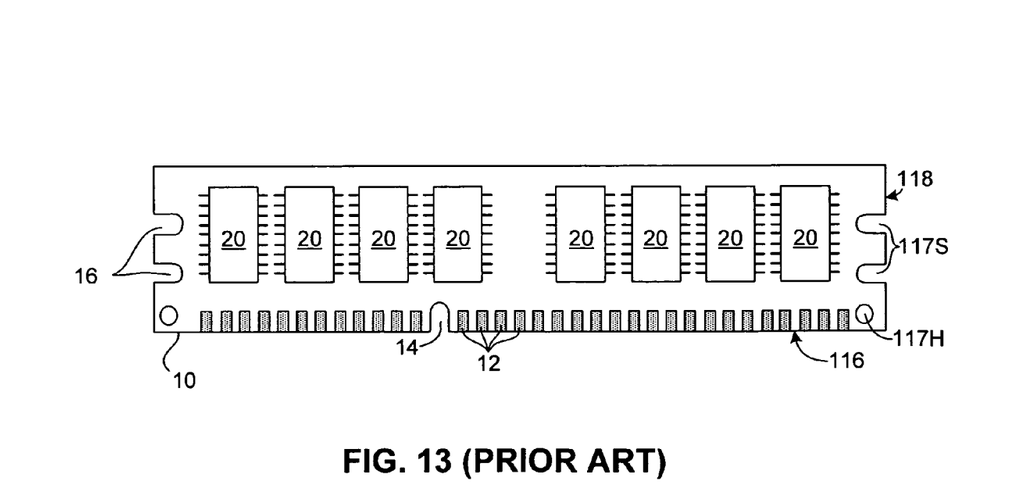
FIG. 13 is a top view showing a conventional memory module PCBA.

FIG. 13 is a diagram showing a memory module with dynamic-random-access memory (DRAM) devices. The memory module contains substrate 10, with surface-mounted DRAM devices 20 mounted directly to the front surface or side of substrate 10, while more DRAM devices (not visible) are usually mounted to the back side or surface of substrate 10. Metal contact pads 12 are positioned along the bottom or connector edge of the module on both front and back surfaces. When the memory module is mounted into a host system (e.g., a personal computer (PC)), metal contact pads 12 mate with pads on a module socket (not shown) to electrically connect the module to the host system's motherboard. Holes and/or notches 14, 16 are sometimes used to ensure that the module is correctly positioned in the socket. For example, notch 14 can be offset from the center of substrate 10 to ensure that the memory module cannot be inserted backwards in a socket. Notches 16 match with clamps of the module socket to ensure that the memory module is securely positioned in the socket.

As processor speeds have increased, the need for faster memory has become more critical. Various bandwidth-enhancing methods and memory interfaces have been used. Memory chips have higher densities and operate at higher frequencies than before, producing more waste heat from the memory chips. Thus, a need has arisen to remove this waste heat from memory modules.

Conventional memory module assemblies typically include three components: the memory module PCBA and two metal heat-sink plates that are coupled together using one or more fasteners, such as a metal clamp. The contact between PCBA and metal heat-sink plate is usually aided by sandwiching a tape of thermal interface material (TIM) in-between. Various heat-sink plates have been designed for producing such memory module assemblies. See for example U.S. Pat. Nos. 6,362,966, 6,424,532, and 6,449,156, among others. Clamp-on heat-sink plates for memory modules are also known. For example, OCZ Technology produces a copper heat sink with wider metal bands that clip the heat sink to over the front and back surfaces of the memory module. These clip-on and clamp-on designs increase the manufacturing costs and complexity of the associated memory modules because they are difficult to incorporate into automated production lines. Further, the use of clamps or similar structures facilitates easy disassembly by users, resulting in undesirable situations. Moreover, the presence of the clamps and thermal interface material increase the overall thickness of the memory module assembly, thereby taking up valuable motherboard space.

Some memory-module heat sinks feature a closed-top design that prevents airflow in the small gaps between the heat sink and the memory module substrate. Often the entire top edge of the heat sink is closed, providing no path for air to flow under the heat sink other than back out the bottom edge, which is usually open. Sides may be open or partially open, but the sides are much smaller than the top and bottom edges of the memory module, limiting the possible air-flow.

What is needed is a memory module assembly having a protective metal heat-sink plate (shield) mounted over the surface mounted IC devices of a memory module PCBA that both serves to protect the PCBA and to dissipate heat generated by the IC devices, and is easily and inexpensively produced using automated methods.

SUMMARY OF THE INVENTION

The present invention is directed to a memory module assembly including one or more heat sink plates that are directly attached to one or more of the integrated circuits (IC) devices of a memory module printed circuit board assembly (PCBA) using an adhesive, whereby the heat-sink plates both protect the memory module PCBA and dissipate heat generated by the IC devices thereof. By directly attaching the heat-sink plates to the IC devices of the memory module PCBA, the present invention facilitates a simplified automated manufacturing method that greatly reduces overall production costs.

The memory module assembly of the present invention utilizes a memory module PCBA that is essentially identical to conventional memory modules, thus allowing the present invention to be utilized with existing electronics. That is, similar to conventional memory modules, the IC devices are surface mounted on one or both surfaces of a printed-circuit board (PCB) substrate. The PCB substrate includes metal contact pads arranged along a connector (bottom) edge, and multiple wiring traces that provide signal paths between the IC devices and the contact pads. An important aspect of the present invention is the IC devices are packaged and surface mounted on the PCB substrate such that an upper surface of each of these IC devices defines a plane that is substantially parallel to the planar PCB surface on which it is mounted, although the height of each IC device may vary. In particular, the planar upper surfaces of these IC devices are used to secure the memory module PCBA to planar underside surfaces of the heat sink plates by way of the adhesive.

According to an embodiment of the present invention, the adhesive is a heat-activated or heat-cured adhesive that is applied to either the upper surface of the one or more IC devices, or to the planar underside surfaces of the heat-sink plates. When applied, the adhesive is viscous and has a relatively low adhesion to facilitate manipulation of the cover and memory module PCBA until a desired orientation is achieved. The adhesive is then compressed between the heat-sink plate and IC devices, and is held in the compressed state using a fixture. The fixture is then passed through an oven maintained at a specified temperature (i.e., at or lower than the maximum safe operating temperature for the memory module components) to activate or cure the adhesive. In one embodiment, a heat-activated adhesive is used that exhibits a relatively low adherence prior to being heated to a high temperature (i.e., equal to or less than the maximum safe operating temperature of the memory module assembly), and the heat-activated adhesive exhibits a high adherence when subsequently cooled. In this case, subsequent removal of the heat-sink plates from the memory module PCBA requires reheating at a predetermined temperature to reflow the adhesive. In another embodiment, the heating process is used to "cure" a relatively highly thermally conductive adhesive, subsequent separation of the heat-sink plate requires the use of a chemical solvent to dissolve the heat-cured adhesive. In both cases, unauthorized tampering (i.e., removal of the heat-sink plates to access the IC devices) is rendered more difficult and easier to detect than conventional memory modules that utilize clips or fasteners. Further, the heat-cured adhesive is thin and thermally conductive to reduce thermal resistance between the IC devices and the heat-sink plates, thus facilitating a relatively high rate of heat flow from the IC devices to maintain relatively low operating temperatures. Thus, the use of heat-activated and/or heat-cured adhesive facilitates a greatly thinner memory module with heat sink and simplified assembly process whereby the heat-sink plates are secured to protect the memory module PCBA in a manner that reduces overall manufacturing costs, and prevents unauthorized tampering.

According to another embodiment of the present invention, the one or two heat-sink plates are respectively attached to the memory module PCBA solely by the adhesive attached between the cover and the one or more IC devices. Unlike conventional assemblies that utilize clips and/or fasteners to secure the heat sink covers to the memory module substrate and/or to each other, in one embodiment, the adhesive is relied upon solely to secure the cover to the memory module, thereby greatly simplifying the production process. In alternative embodiments, one or more fasteners may be utilized in addition to the adhesive to provide a more rigid connection between the memory module PCBA and the heat-sink plates.

According to yet another embodiment of the present invention, the adhesive is used to attach one or more first IC devices to an associated heat-sink plate, whereas a conventional (i.e., non-adhesive) thermal transfer material is sandwiched between one or more second IC devices and the associated heat-sink plate to provide greater (or lesser) heat flow from the second IC devices to the associated heat-sink plate. In one specific embodiment, the thermal interface material exhibits a higher thermal conductivity than the adhesive, thereby providing greater cooling to the second IC devices.

According to another embodiment of the present invention, the cover is provided with edge features and slots that maximize cooling of the IC devices. The cover edges are aligned along the memory module substrate along the top edge opposite the lower (connector) edge, and along the upper half of the substrate's side edges. In one or more embodiments, the top edge is spaced from the memory module PCBA to allow air to flow between the PCBA and the heat-sink plates (i.e., through small gaps between the IC devices), thereby maximizing heat transfer from the memory module during use.

DETAILED DESCRIPTION

The present invention relates to improvements in memory module assemblies (i.e., a memory module printed circuit board assembly (PCBA) and one or more heat-sink plates). The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figures 1A, 1B:
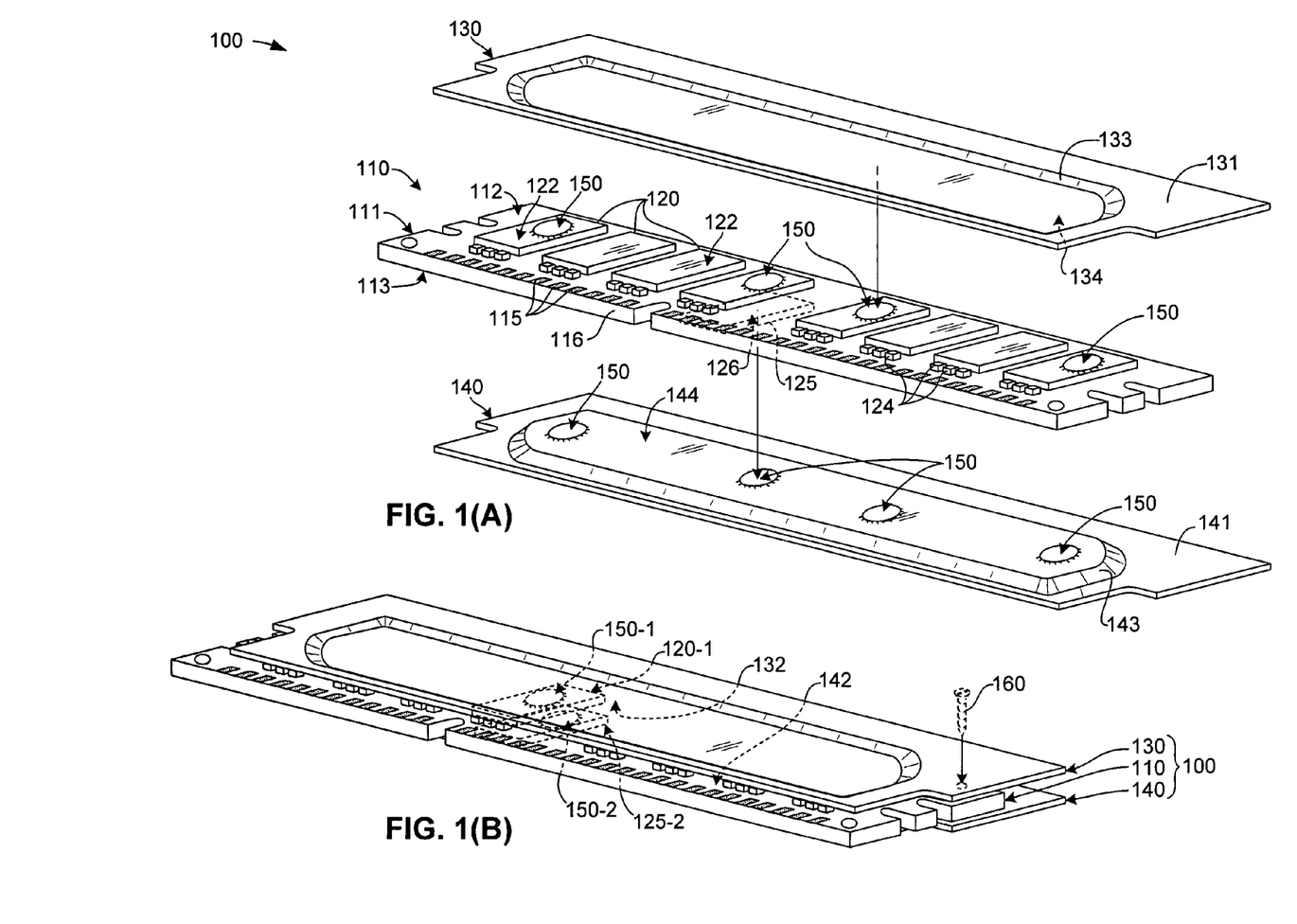
FIGS. 1(A) and 1(B) are an exploded perspective view and an assembled perspective view, respectively, showing a memory module assembly according to an embodiment of the present invention.
Figure 2:
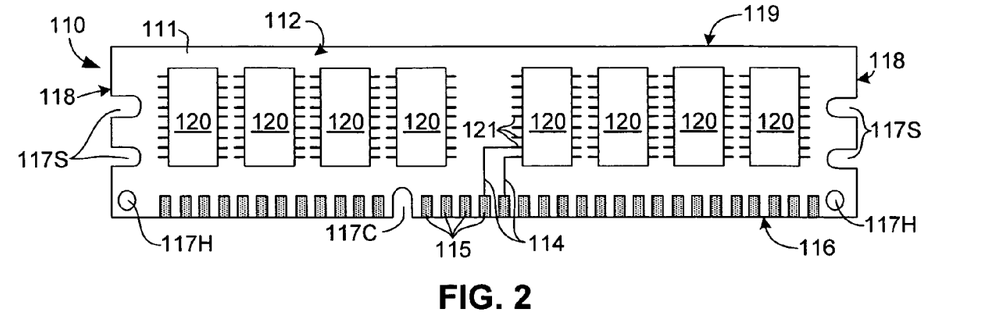
FIG. 2 is a top view showing a memory module PCBA of the memory module assembly shown in FIG. 1(A).
Figure 3:
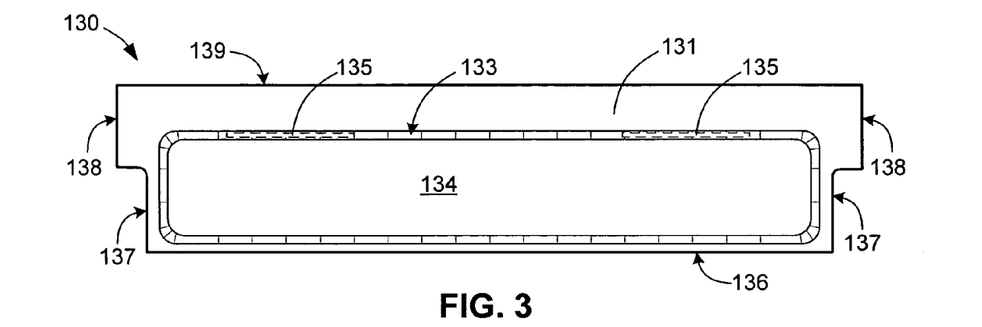
FIG. 3 is a top view showing a heat-sink plate of the memory module assembly shown in FIG. 1(A).
Figure 4A:
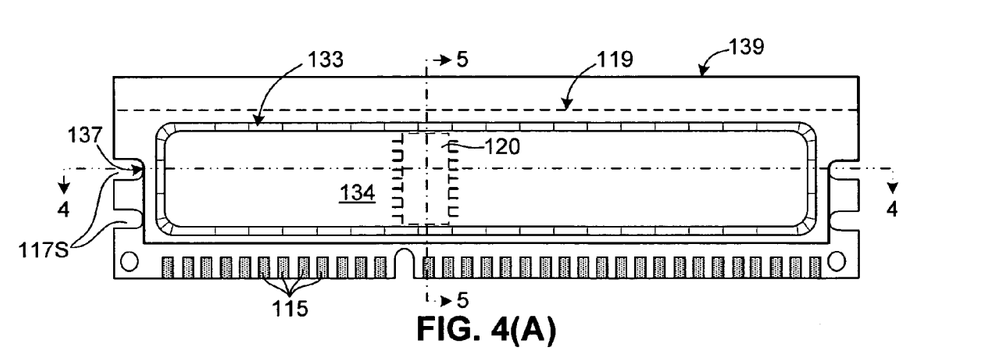
FIGS. 4(A) and 4(B) are top and cross-sectional side views showing the memory module assembly shown in FIG. 1(A).
Figure 4B:
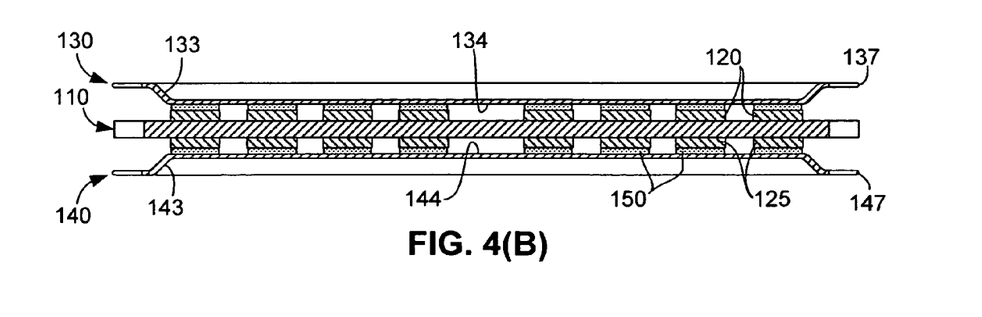
Figure 5:
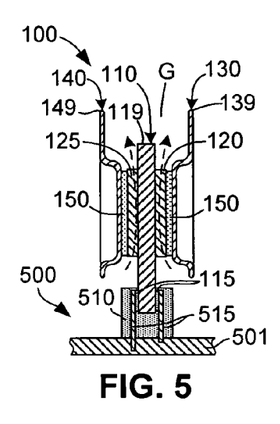
FIG. 5 is a cross-sectional end view showing the memory module assembly shown in FIG. 1(A).

FIGS. 1(A) to 5 show a memory module assembly 100 according to a simplified embodiment of the present invention. Memory module assembly 100 generally includes a memory module PCBA 110 and one or more heat-sink plates 130 and 140. FIGS. 1(A) and 1(B) are exploded perspective and assembled perspective views, respectively, showing the basic components of memory module assembly 100. FIG. 2 is a top view showing memory module PCBA 110 by itself, and FIG. 3 is a top plan view showing heat-sink plate 130 by itself. FIGS. 4(A) and 4(B) are top and cross-sectional side views, respectively, showing heat-sink plates 130 and 140 mounted on memory module PCBA 110. Finally, FIG. 5 is a cross-sectional end view taken along section line 5—5 of FIG. 4(A). Although the embodiment described below utilizes two heat-sink plates (i.e., plates 130 and 140) mounted onto opposite sides of memory module PCBA 110, unless otherwise specifically recited in the appended claims, only one heat-sink plate (i.e., plate 130 or plate 140) may be attached to only one side of memory module PCBA 110 in the manner described below.

Referring to FIGS. 1(A) and 2, memory module PCBA 110 includes a printed circuit board (PCB) substrate 111 having an upper (first) surface 112 and an opposing lower (second) surface 113, and several integrated circuit (IC) memory devices (e.g., dynamic-random-access memory (DRAM) devices) 120 and/or 125 that are mounted on at least one of the upper and lower surfaces. PCB substrate 111 includes a network of wiring traces 114 (shown in FIG. 2) that are formed on at least one of upper surface 112 and lower surface 113, and extend through layers of insulating material (e.g., FR4) according to known manufacturing techniques. Selected wiring traces 114 are connected between contact leads 121 of selected memory devices 120 and associated contact pads 115 that are arranged in a row along a lower (connector) edge 116 on both surfaces 112 and 113 of PCB substrate 111. Metal contact pads 115 facilitate pluggable connection of memory module assembly 100 into a host system (e.g., a PC or other computer system) to increase available memory capacity by way of memory devices 120. Referring to FIG. 5, when memory module assembly 100 is mounted into a host system 500, metal contact pads 115 mate with pads 515 on a module socket 510 to electrically connect the module to the host system's motherboard 501. Optional side edge notches 117S, holes 117H, and connector edge notch 117C are provided along side edges 118 and connector edge 116 to ensure that the module is correctly positioned in the socket. Upper edge 119 is located opposite to connector edge 116.

Although generally referred to herein as memory devices, IC devices 120 and 125 may include one or more additional control IC devices, such as a processor, an application specific integrated circuit (ASIC), and/or a programmable logic device (PLD). Further in addition, to IC devices 120 and 125, additional electrical and electronic components 124 (shown in FIG. 1(A)), such as capacitors and inductors, may be included on PCB substrate 111 using known techniques.

According to an embodiment of the invention, each memory device is packaged such that its upper surface is planar (e.g., Thin Small Outline Package (TSOP)), and is maintained such that each planar upper surface is parallel to PCB substrate 111. For example, as shown in FIG. 1(A), each memory device 120 is mounted on upper surface 112 such that its planar upper surface 122 is maintained parallel to upper surface 112. Similarly, each memory device 125 is mounted on lower surface 113 such that its planar upper surface 126 is maintained parallel to lower surface 113.

Referring to FIGS. 1(A) and 3, heat-sink plates 130 and 140 are metal structures formed, for example, from a suitable sheet metal (e.g., copper or aluminum). As indicated in FIG. 1(A), in one embodiment, heat-sink plate 130 includes a flat peripheral region 131 surrounding a depression (indentation) region 133, and a planar underside surface 134 formed on the outside (convex, lower facing) surface of depression 133. Similarly, heat-sink plate 140 includes a flat peripheral region 141 surrounding a depression (indentation) region 143, and a planar underside surface 144 formed on the outside (upward facing) surface of depression 143. As discussed below, underside surfaces 134 and 144 are secured in the manner described below to one or more associated memory devices 120 and 125. Note that, as indicated in FIG. 4(B), depression regions 133/143 are formed such that the footprint of these regions encloses all of IC devices 120/125 (i.e., such that planar underside surfaces 134/144 contact all of upper surfaces 122/126 of IC devices 120/125). As shown in FIG. 3, one or both heat-sink plates (e.g., plate 130) may include one or more slots 135 for heat dissipation. Each heat-sink plate 130/140 has a lower edge 136/146, side edges 138/148, and an upper edge 139/149. In addition, as shown in FIG. 3, the side edges of each plate are modified to expose the notches formed in PCB substrate 111 (e.g., plate 130 includes groove 137 that for exposing side notches 117S, as indicated in FIG. 4(A)).

As indicated in FIGS. 1(B), 4(A), 4(B) and 5, when heat-sink plates 130/140 are mounted onto memory module PCBA 110, heat-sink plates 130/140 substantially overlap PCB surfaces 112/113 in such a way that IC devices 120/125 are protected, but contact pads 115 are exposed for pluggable insertion of contact pads 115 into host socket 510 (shown in FIG. 5). For example, as indicated in FIGS. 4(A) and 5, front edge 136 of heat-sink plate 130 is aligned above connector edge 116 of PCB substrate 111 such that contact pads 115 extend below lower edges 136/145 of heat-sink plates 130/140, and upper edges 139/149 of heat-sink plates 130/140 protrude above upper edge 119 of PCB substrate 111. Referring to FIG. 5, an opening (gap) G is provided between heat-sink plates 130/140 and PCB substrate 111 adjacent to upper edges 139/149 to allow air heated by IC devices 120/125 to escape. Note that side edges 137/147 and upper edges 139/149 of heat-sink plates 130/150 may be bent inward/downward to narrow the space therebetween (e.g., gap G) to provide a better protection for the electronic components from potential dust contamination, but this may reduce air flow. The upward air flow (e.g., as indicated by dashed arrows in FIG. 5) induced by free convection will enhance heat dissipation from IC devices 120/125, and thus reduce the operating temperature of memory module assembly 100. Of course, in addition to the heat dissipated by free convection in the generally upward directions, heat is also dissipated to the surrounding air from the external surfaces of heat-sink plates 130/140 by free convection and radiation.

Referring to FIGS. 1(A), 1(B), 4(A), 4(B) and 5, according to the present invention, adhesive portions 150 are applied to planar upper surfaces 122/126 of selected memory devices 120/125 and/or to planar underside surfaces 134/144 of heat-sink plates 130/140, and are then sandwiched therebetween in a manner that secures heat-sink plates 130/140 to memory module PCBA 110. For example, as indicated in FIG. 1(B), a discrete adhesive portion 150-1 (shown in dashed lines) is sandwiched between planar underside surface 134 of heat-sink plate 130 and upper surface 122 of an associated IC device 120-1 (also shown in dashed lines) such that heat-sink plate 130 is secured to memory module PCBA 110 by adhesive portion 150-1. Similarly, a second discrete adhesive portion 150-2 is sandwiched between planar underside surface 144 of heat-sink plate 140 and upper surface 126 of an associated IC device 125-2 (also shown in dashed lines) such that heat-sink plate 140 is secured to memory module PCBA 110 by adhesive portion 150-2. By securing heat-sink plates 130/140 to memory module 110 using adhesive portions 150 instead of fasteners, the manufacturing process for producing memory module assemblies 100 is greatly simplified, and in addition tampering (i.e., removal of heat-sink plates 130/140 to access IC devices 120/125) is more reliably prevented and more easily detected.

According to an embodiment of the present invention, adhesive portions 150 comprise heat-activated adhesive that is applied to either upper surfaces 122/126 of one or more IC devices 120/125, or to the planar underside surfaces 134/144 of heat-sink plates 130/140. In this embodiment, the heat-activated adhesive 150 is softened (i.e., exhibits a relatively low adherence) when heated to a high temperature (i.e., equal to or less than the maximum operating temperature of the memory module assembly), and the heat-activated adhesive exhibits a high adherence when subsequently cooled. The advantage of such heat-activated adhesives is that they can be removed by heating, and thus enable reworking. In this case, subsequent removal of the heat-sink plates from the memory module PCBA requires reheating at a predetermined temperature to reflow the adhesive. Heat-activated adhesives of this type are typically produced in the form of thin film or tape can be used for IC devices that generate less heat, and the main purpose of heat-sink plates 130/140 is thus relegated to mainly protecting the IC devices. Such heat-activated adhesive material forms a thin and continuous layer between the heat-sink plate and the upper external surface of the IC devices. As the newly formed interface layer is thin and can be made substantially void-free (i.e., very few air bubbles), the thermal resistance through the adhesive layer is relatively small. The ability to rework, for example through heating, becomes an important consideration. Thermoplastic based adhesive material such as thermal bonding film (e.g., product number TBF668) produced by 3M of St. Paul Minn., or hot melt film (e.g., product number 7802) produced by Henkel Loctite Corp. (Industrial) of Rocky Hill Conn. can be used as an adhesive in this application.

While heat-activated adhesives provide an advantage in that they can be reworked by reheating, such adhesives typically exhibit relatively low thermal conductivity, thus making them less desirable in applications that require a high level of heat dissipation through the heat-sink plates.

In another embodiment, adhesive portions 150 comprise an adhesive material that is "cured" during a heating process (i.e., exhibits an initial, relatively low adherence when applied, and a relatively high adherence after being heat-cured). Such heat-cured adhesives typically exhibit relatively high thermal conductivity relative to heat-activated adhesives, and are therefore more desirable in applications that require a high level of heat dissipation through the heat-sink plates. The heat-cured adhesive material is applied in the form of paste, and is re-distributed under heat and pressure during curing to bond the IC devices and heat-sink plates together. The curing process takes place at elevated temperature, and can be expedited with the use of activator. The re-distribution process causes the adhesive material to flow and fill the void between the heat sink plate and memory surface, resulting in a thin, good contact therebetween that reduces thermal resistance from the heat source (IC device) to the heat-sink plate. A dispensing machine can be used to ensure even distribution of the adhesive material. In one embodiment, the heat-cured adhesive consists of silicone elastomer-based resin for re-workability and survivability at elevated temperature that the electronic components may encounter. Metallic fillers may be added to improve thermal conductivity. On suitable heat-cured adhesive is provided by Dow Corning (e.g., product number 3-6752). Such adhesives are removed using solvent to enable rework.

Although heat-activated and heat-cured adhesive materials provide superior connection between the heat-sink plates and memory module PCBA, it is also possible to use other types of adhesives in the manner described herein to provide suitable connections. Therefore, unless otherwise specified in the appended claims, the term "adhesive portion" is intended to include any non-corrosive adhesive that can reliably connect the heat-sink plates and memory module PCBAs described herein.

In addition, although the present invention is described above with certain benefits associated with attaching heat-sink plates 130 and 140 to memory module PCBA 110 solely by adhesive portions 150, in some embodiments an optional fastener (e.g., a screw 160, rivet or clamp, which is shown in dashed lines in FIG. 1(B)) or clip may be utilized to further strengthen the assembly connection.

Figure 6:
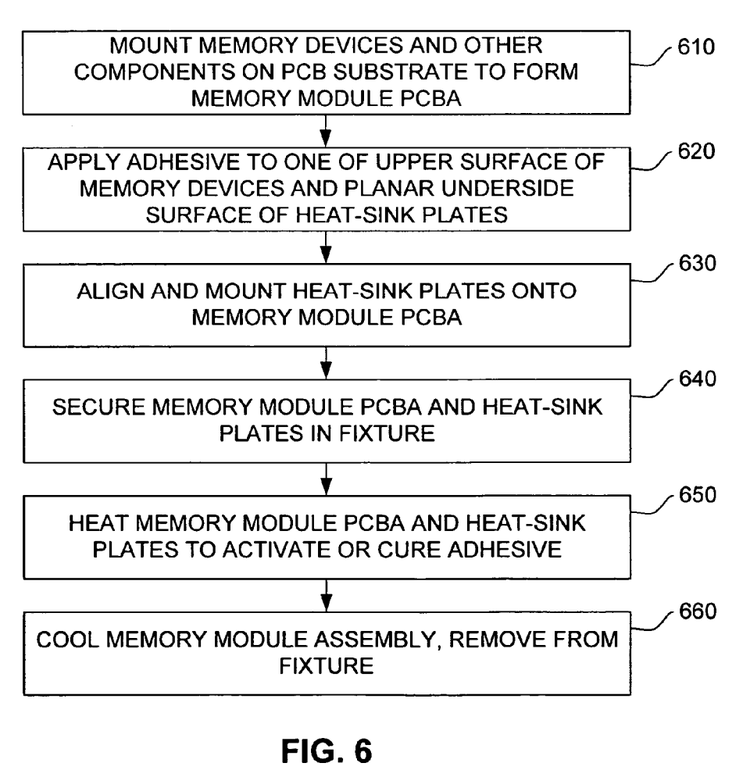
FIG. 6 is a flow diagram showing a manufacturing method according to another embodiment of the present invention.

FIG. 6 is a flow diagram showing a method for manufacturing a memory module assembly according to another embodiment of the present invention. The description below refers to reference numbers and other features associated with memory module assembly 100, which is described above with reference to FIGS. 1(A) to 5.

Referring to the top of FIG. 6, the manufacturing process begins by mounting memory and other IC devices 120/125 onto PCB substrate 111 to form memory module PCBA 110 (block 610). Next, adhesive portions 150 are applied to either upper surfaces 122/126 of IC devices 120/125 or to planar underside surfaces 134/144 of heat-sink plates 130/140 (block 620). When applied, the adhesive portions 150 are either viscous and have a relatively low adhesion or in the form of a film/tape that have little adhesion, to facilitate manipulation of heat-sink plates 130/140 and memory module PCBA 110 until a desired orientation is achieved. Heat-sink plates 130/140 are then aligned and mounted onto memory module PCBA 110 in the manner described above (block 630).

Figure 7:
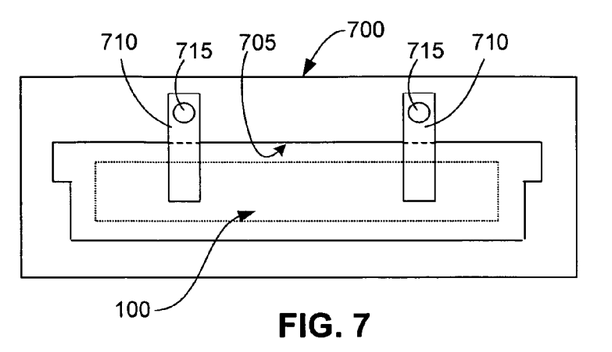
FIG. 7 is a top plan view showing a fixture utilized in the method of FIG. 6.

According to a specific embodiment of the present invention, the thus-assembled structure is then secured into a fixture (640) and then subjected to a heating process to activate/cure the adhesive portions 110 (650). A simplified fixture 700 suitable for this heating process is illustrated in FIG. 7. Fixture 700 includes a block (e.g., metal or ceramic) defining a cavity 705 that is sized to receive memory module assembly 100, and also includes a fastening mechanism (e.g., spring-assisted clamps 710 that are tightened using screws or other fasteners 715) to hold memory module assembly 100 firmly (i.e., such that heat-sink plates 130/140 are respectively pressed against associated IC devices 120/125 located on opposing sides of memory module PCBA 110). The thus-secured fixture/assembly structure is then heated, for example, by passing the structure through an oven maintained at a selected temperature (i.e., a temperature at or below the maximum safe-operating temperature (i.e., the temperature at which the IC devices may be operated without being damaged) of the memory module components) to activate or cure the adhesive (block 650). Note that the memory module assembly is carried by fixture 700, which in turn can be carried on a conveyor through the oven, and is thus reliably heated to the specified temperature to facilitate the bonding process. After activating/curing the adhesive, the fixture is removed from the oven and allowed to cool, and then the memory module assembly is removed from the fixture (block 660).

The embodiment described above with reference to FIGS. 1(A) to 5 includes heat-sink plate edge features that maximize cooling efficiency by allowing essentially unimpeded airflow under the heat sink plates (i.e., between the heat sink plates and the PCB substrate). Even though the area between the heat sink and substrate is small and mostly occupied by the IC (e.g., memory and controller) devices, small gaps between adjacent pairs of IC devices can channel air flow past the IC devices, directly cooling the IC devices as well as cooling the heat sink plate from both the underside surface and its larger, exposed top surface. The inventors encourage this airflow through the tiny channels between IC devices by maintaining openings (e.g., gap G shown in FIG. 5) near the top edge of the memory module assembly. These openings allow air to escape from between the PCB substrate and the heat sink plates. Air enters the gaps between the heat sink and the PCB substrate from the open bottom edge near the lower connector edge, and flows between the memory devices and out the top-edge openings. Stagnant air under the heat sink plates is thus reduced.

Figure 8:
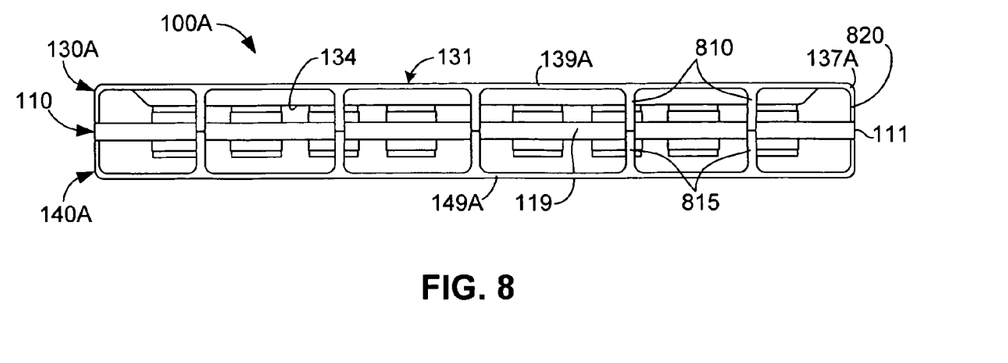
FIG. 8 is a side view showing a memory module assembly according to another embodiment of the present invention.
Figure 9:
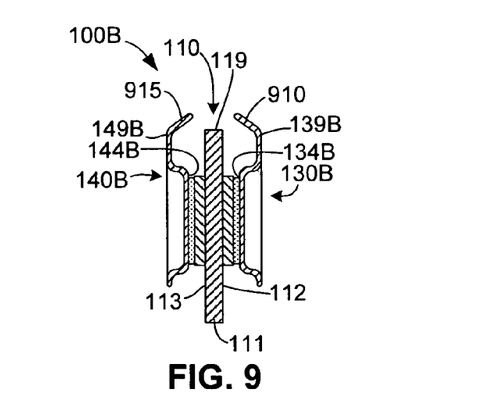
FIG. 9 is a cross-sectional end view showing a memory module assembly according to another embodiment of the present invention.
Figure 10:
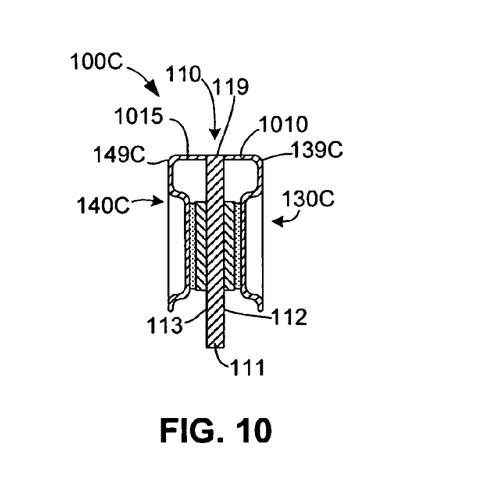
FIG. 10 is a cross-sectional end view showing a memory module assembly according to another embodiment of the present invention.

FIGS. 8 to 10 (described below) disclose alternative embodiments in which the heat-sink plate edge features are modified to include ribs or walls that bend toward the memory module PCBA, thus sacrificing maximum airflow for protection for the IC devices mounted on the memory module PCBA and also to facilitate air flow over these IC devices.

FIG. 8 is an end view showing an alternative memory module assembly 100A in which heat-sink plates 130A and 140A are constructed such that several rib-like structures 810/815 extend from upper edges 139A/149A toward PCB substrate 111, each adjacent pair of ribs being separated by an open region that facilitates airflow. Ribs 810/815 may be formed such that the ends of opposing ribs 810/815 may meet in the manner shown in FIG. 8, or are separated by a small gap. In addition, heat-sink plate 130A also includes a sidewall structure 820 that extends from side edge 137A toward PCB substrate 111.

FIG. 9 is a cross-sectional side view showing another memory module assembly 100B in which heat-sink plates 130B and 140B are constructed such that upper edges 139B/149B are generally aligned with back edge 119 of PCB substrate 111, and walls 910/915 extend from upper edges 139B/149B at acute angles (e.g., 45°) relative to the planar underside surfaces 134B/144B, thereby providing both an opening for airflow and some protection for the IC devices of memory module PCBA 110.

Although the embodiments above include heat-sink plates that extend above the upper edge of the associated memory module PCBA, other embodiments are also possible.

FIG. 10 is a cross-sectional side view showing another memory module 100C in which heat-sink plates 130C and 140C are constructed such that upper edges 139C/149C are aligned with back edge 119 of PCB substrate 111, and walls 1010/1015 extend from upper edges 139C/149C and contact surfaces 112/113 adjacent to back edge 119. Contact between walls 1010/1015 and surfaces 112/113 increases the stability and rigidity of the connection between memory module PCBA 110 and heat-sink plates 130C/140C. In one specific embodiment, walls 1010 and 1015 are solid (i.e., there are no gaps or openings between heat-sink plates 130C/140C and upper edge 119 of PCB substrate 111) to maximize protection of the IC devices. This specific embodiment may be used, for example, in cases where heat generated by the IC devices is relatively small, and free convection from the outside surface of the heat-sink plates is adequate to maintain the electronic components at specified temperature. In another specific embodiment (not shown), the lower edges of walls 1010/1015 may be sized such that they do not quite contact surfaces 112/113, thereby leaving a narrow gap to provide airflow. In yet another specific embodiment, openings (not shown) similar to those shown in FIG. 8 may be formed in walls 1010/1015 to provide airflow.

Figure 11:
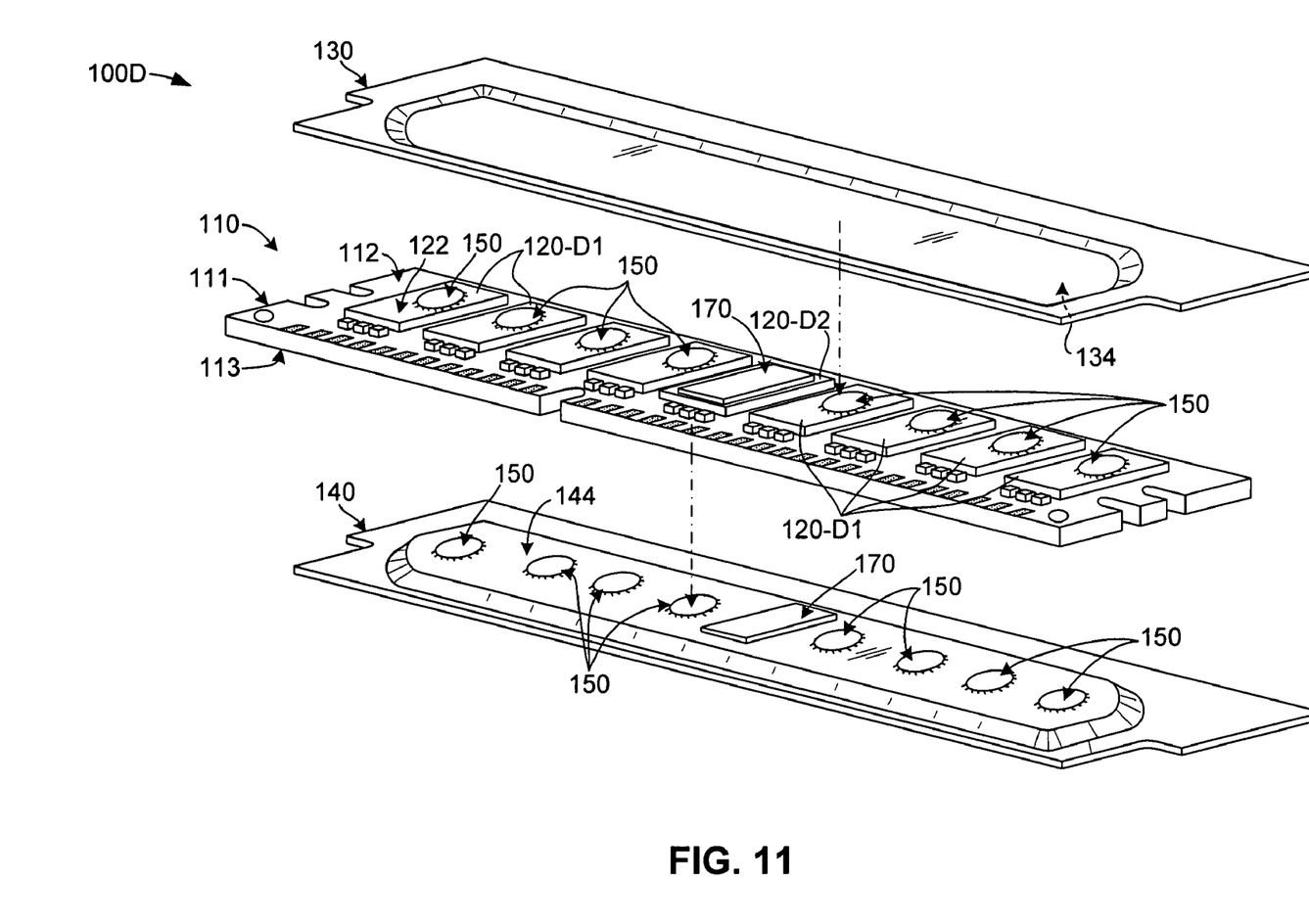
FIG. 11 is an exploded perspective view showing a memory module assembly according to another embodiment of the present invention.

FIG. 11 shows a memory module assembly 100D according to another embodiment of the present invention. Memory module assembly 100D may be utilized, for example, when the heat generated from each IC device of memory module PCBA 110 is not equal (i.e., first IC devices 120-D1 generate less or more heat than second IC devices 120-D2). An example of such a memory module assembly exhibiting these differing heat generating characteristics is a Fully-Buffered DIMM using Ball Grid Array (BGA) packaging.

Referring to FIG. 11, similar to the previously described embodiments, memory module assembly 100D includes memory module 110 and heat-sink plates 130 and 140, and several first IC devices 120-D1 are sandwiched between surface 112 of PCB substrate 111 and planar underside surface 134 of heat-sink plate 130 by way of adhesive portions 150 (a corresponding group of IC devices provided on lower surface 113, not shown, are also sandwiched between substrate 111 and planar underside surface 143 of heat-sink plate 140 in this manner).

In accordance with another aspect of the present invention, memory module assembly 100D further includes at least one thermal interface material portion (e.g., thermal grease, pad, film) 170 that is sandwiched between planar underside surface 134 and upper surface of at least one second IC device 120-D2 (corresponding second IC devices provided on lower surface 113, not shown, also include thermal interface material portions). According to the present embodiment, thermal interface material portions 170 differ from adhesive portions 150 in that they have a relatively high thermal conductivity, and do not provide adhesion between the IC devices and heat-sink plates. Thus, thermal interface material portions 170 are formed over IC devices 120-D2 that generate a relatively high amount of heat during operation, whereas adhesive portions 150 are formed over IC devices 120-D1 that generate a relatively low amount of heat during operation. The thermal interface material may be provided in the form of thermal grease (Vantec Thermal Paste) or thermally conductive adhesive (Dow Corning 3-6752 thermal conductive compound) that is sandwiched between second IC devices 120-D2 and heat-sink plate 130 in a manner similar to that described above with reference to adhesive portions 150. Such thermal interface material is replaced after each re-work.

Figure 12:
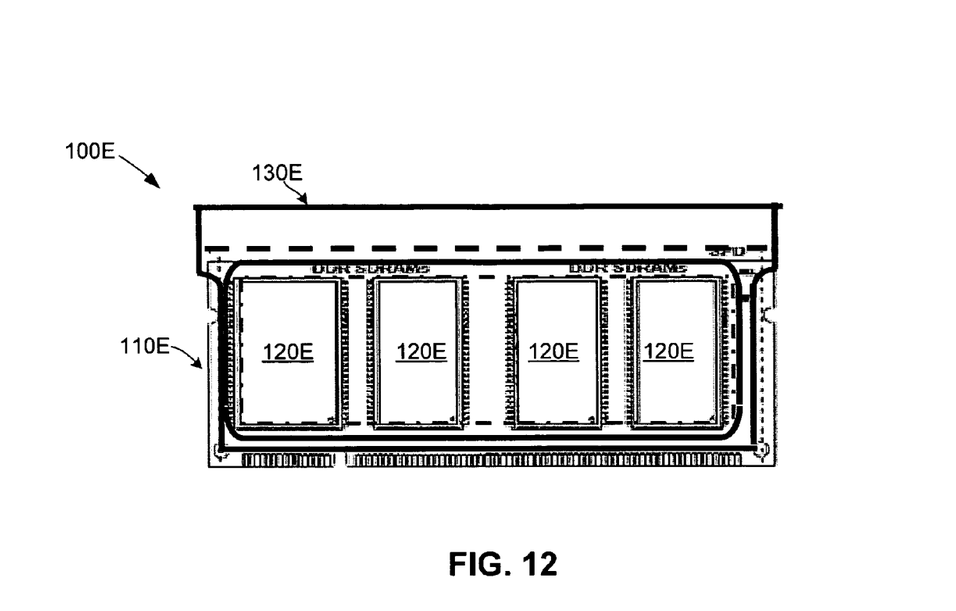
FIG. 12 is a top view showing a memory module assembly according to another embodiment of the present invention.

FIG. 12 is a modified top view showing a memory module assembly 100E according to yet another embodiment of the present invention. Memory module assembly 100E differs from previously described embodiments in that it includes a memory module PCBA 110E that is in the form of a Small Outline Dual Inline memory Module (SODIMM). This type of memory module is used mostly for notebook computers, with Thin Small Outline Package (TSOP). The number of memory devices 120E is typically reduced in half, with each side of memory module assembly 100E including a row of up to four devices. Adhesive is applied according to the previously described embodiments to the memory devices or the inside of the heat-sink plates (e.g., heat sink plate 130E), before the heat sink plates are attached to the memory module PCBA 110E. All the other features of memory module assembly 100E are similar to those described above. Further, in addition to the SODIMM arrangement shown in FIG. 12, the present invention may be incorporated into memory module assemblies including any of a Single Inline Memory Module (SIMM) device, a Dual Inline Memory Module (DIMM) device, a Small Outline DIMM (SODIMM) device, and a Fully-Buffered DIMM (FB-DIMM) device.

Several other embodiments are contemplated by the inventors. For example the heat sink may be made from a variety of heat-conducting materials such as aluminum, aluminum alloy, copper, brass, bronze, stainless steel, etc.

In addition to adhesive, rivets and/or other fasteners could be used to connect the covers to the memory module substrate. For example, small nuts and bolts, or screws and nuts could be used. These fasteners provided secure and fixed attachment rather than wobbly or temporary attachment. Holes for these fasteners can be added to the memory module substrate. These fastener holes are not normally present in a standard memory module.

Two, three or four DRAM chips could be stacked together at each chip location on the memory module. Some memories may have more than one chip select (CS) input, and some combination of these chip selects could be used to select the DRAM chips.

The number of DRAM chips, capacitors, buffers, and other components on each side of the substrate can be varied. Wide or narrow DRAM chips of one, two, four, eight or more bits in width may be substituted. Other kinds of Integrated Circuits (IC's) or chips can be mounted on the substrate too, such as an address or bank decoder, a parity generator, an error detector, and/or a serial programmable device (SPD) for identifying the memory module.

Memory modules produced in accordance with the present invention may use improved DRAM's such as synchronous DRAM (SDRAM), double data rate (DDR) SDRAM, second-generation double data rate (DDR2) SDRAM, Rambus DRAM (RDRAM), direct Rambus DRAM (DRDRAM) or synchronous-pipelined DRAM (SP-DRAM). Memory modules produced in accordance with the present invention may also include SIMM, and FB-DIMM type memory modules. As an alternative to DRAM's, other memory types (SRAM, ROM, EPROM) could be used. Flash memories using electrically-erasable programmable read-only memory (EEPROM) technology, or some other technologies (ferro-electric FRAM, magnetic or magneto-resistive MRAM, etc.) could be used by the memory modules.

Terms such as "upper edge", "side edge", "lower edge", "front surface", "back surface" and "underside surface" are arbitrarily assigned as shown in the figures and each term could refer to either surface of the module and/or heat-sink structure. Vias of through-holes may provide electrical connection between the surfaces or intermediate layers. These through-holes could be filled in holes or metal traces between layers rather than open holes, and can also be formed during the PCB processing as an integral part of the PCB. Various alternatives in geometries of the heat-sink plates and memory modules could be substituted.

The invention could be used to stack other kinds of memory chips than DRAM, such as SRAM and flash memories, etc. The invention could be applied to other kinds of modules besides memory modules, and could be used for stacking other kinds of chips such as buffers, registers, latches, processing arrays, etc.

The electrical assignment of functions or signals to the contact pads ("pins") located along the lower edge of the module, is usually determined by an industry standard-setting committee, such as JEDEC. JEDEC specifies the order of the pins and the size of the module to allow for interchangeability of modules with sockets. Redundant power and ground pins are usually assigned symmetric positions to avoid reversing the power and ground supplies if the module is inserted backwards. DRAM chips are usually connected to a data pin as close to the chip as possible to minimize wiring lengths and signal delays. Older 72-pin modules are being replaced by 168-pin and larger modules. Multi-layer printed circuit board (PCB) substrates can share the power and ground planes with signal traces to reduce the number of layers used from eight layers to six layers or even four layers. Many other configurations are possible.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A memory module assembly comprising:
   a memory module printed circuit board assembly (PCBA) including:
     a substrate having opposing first and second surfaces, a plurality of wiring traces formed on the first and second surfaces, at least some of the wiring traces being connected to metal contact pads formed along a connector edge of the substrate, and
     a plurality of first integrated circuit (IC) devices mounted on the first surface of the substrate such that an upper surface of each of the plurality of first IC devices is parallel to the first surface of the substrate;
   a first heat-sink plate having a planar underside surface; and
   a plurality of adhesive portions, each adhesive portion being sandwiched between the planar underside surface of the first heat-sink plate and the upper surface of an associated IC device of said plurality of first IC devices such that the first heat-sink plate is rigidly secured to the memory module by the plurality of adhesive portions,
   wherein each of the plurality of adhesive portions comprises one of a heat-activated adhesive material and a heat-cured adhesive material.

2. The memory module assembly according to claim 1, wherein the heat-activated adhesive material is characterized by exhibiting a first adherence when heated to a first temperature, and exhibiting a second adherence when subsequently cooled to a second temperature, wherein the first adherence is lower than the second adherence, and the first temperature is higher than the second temperature.

3. The memory module assembly according to claim 1, wherein the heat-cured adhesive material is characterized by exhibiting a first adherence when applied, and exhibiting a second adherence when subjected to heating, the first adherence being lower than the second adherence.

4. The memory module assembly according to claim 1, further comprising a fastener connected between the first heat-sink plate and the memory module.

5. The memory module assembly according to claim 1, wherein the first heat-sink plate is mounted onto the memory module PCBA such that the first heat-sink plate substantially overlaps the first surface in such a way that the plurality of first IC devices are covered by the first heat-sink plate, and the connector edge is exposed such that the contact pads are exposed for pluggable insertion into a host socket.

6. The memory module assembly according to claim 1,
wherein an upper edge of the first heat-sink plate is substantially aligned with an upper edge of the substrate, and
wherein the first heat-sink plate further comprises at least one wall extending from at least one of the upper edge and side edges of the first heat-sink plate, and
wherein said at least one wall extends substantially perpendicular to the planar underside surface.

7. The memory module assembly according to claim 6, wherein said at least one wall contacts the first surface of the substrate.

8. The memory module assembly according to claim 1,
wherein the memory module further comprises a plurality of second IC devices mounted on the second surface of the substrate such that an upper surface of each of the plurality of second IC devices defines a plane that is parallel to the second surface, and
wherein the memory module assembly further comprises a second heat-sink plate having a second planar underside surface, and a plurality of second heat-activated adhesive portions, each of said second heat-activated adhesive portions being sandwiched between the second planar underside surface and the upper surface of an associated IC device of said plurality of second IC devices such that the second heat-sink plate is rigidly secured to the memory module by the plurality of second adhesive portions.

9. The memory module assembly according to claim 1, wherein the memory module PCBA comprises one of a Double Data Rate (DDR) device, a second-generation double data rate (DDR2) device, a Single Inline Memory Module (SIMM) device, a Dual Inline Memory Module (DIMM) device, a Small Outline DIMM (SODIMM) device, and a Fully-Buffered DIMM (FB-DIMM) device.

10. A memory module assembly comprising:
a memory module printed circuit board assembly (PCBA) including:
a substrate having opposing first and second surfaces, a plurality of wiring traces formed on the first and second surfaces, at least some of the wiring traces being connected to metal contact pads formed along a connector edge of the substrate, and
a plurality of first integrated circuit (IC) devices mounted on the first surface of the substrate such that an upper surface of each of the plurality of first IC devices is parallel to the first surface of the substrate;
a first heat-sink plate having a planar underside surface; and
a plurality of adhesive portions, each adhesive portion being sandwiched between the planar underside surface of the first heat-sink plate and the upper surface of an associated IC device of said plurality of first IC devices such that the first heat-sink plate is rigidly secured to the memory module by the plurality of adhesive portions,
wherein the first heat-sink plate is secured to the memory module solely by the plurality of adhesive portions.

11. The memory module assembly according to claim 10, wherein the first heat-sink plate comprises a peripheral region surrounding a depression region, the depression region having an inside concave surface and an outside convex surface, and wherein the planar underside surface is located on the outside convex surface of the depression region.

12. The memory module assembly according to claim 11, wherein the depression region of the first heat-sink plate is formed such that the planar underside surface contacts the upper surface of each of the plurality of first IC devices.

13. The memory module assembly according to claim 10, wherein an upper edge of the first heat-sink plate extends over an upper edge of the substrate such that an opening is defined between the first heat-sink plate and the first surface of the substrate adjacent to an upper edge of the first heat-sink plate.

14. The memory module assembly according to claim 13, wherein the first heat-sink plate further comprises a plurality of ribs extending from the upper edge toward the substrate.

15. The memory module assembly according to claim 13, wherein the first heat-sink plate further comprises a plurality of walls extending from the upper edge of the first heat-sink plate at an acute angle relative to the planar underside surface.

16. The memory module assembly according to claim 10, further comprising a thermal interface material sandwiched between the planar underside surface of the first heat-sink plate and the upper surface of a second IC device of said plurality of first IC devices,
wherein each said adhesive portion has a first thermal conductivity, and
wherein the thermal interface material has a second thermal conductivity, the first thermal conductivity being lower than the second thermal conductivity.

17. The memory module assembly according to claim 10, further comprising a thermal interface material sandwiched between the planar underside surface of the first heat-sink plate and the upper surface of a second IC device of said plurality of first IC devices,
wherein each said adhesive portion has a first adhesion between the planar underside surface of the first heat-sink plate and the upper surface of the first IC device, and
wherein the thermal interface material has a second adhesion between the planar underside surface of the first heat-sink plate and the upper surface of the second IC device, the first adhesion being higher than the second adhesion.

* * * * *